(12) United States Patent
Hong

(10) Patent No.: US 10,991,760 B2
(45) Date of Patent: Apr. 27, 2021

(54) MEMORY DEVICE HAVING PUC STRUCTURE

(71) Applicant: SK hynix Inc., Gyeonggi-do (KR)

(72) Inventor: Ji-Hoon Hong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 3 days.

(21) Appl. No.: 16/385,869

(22) Filed: Apr. 16, 2019

(65) Prior Publication Data

US 2020/0091240 A1 Mar. 19, 2020

(30) Foreign Application Priority Data

Sep. 19, 2018 (KR) ........................ 10-2018-0112172

(51) Int. Cl.
*H01L 27/24* (2006.01)
*H01L 27/11509* (2017.01)
*H01L 27/11507* (2017.01)
*H01L 27/22* (2006.01)
*H01L 23/528* (2006.01)

(52) U.S. Cl.
CPC ........ *H01L 27/2463* (2013.01); *H01L 23/528* (2013.01); *H01L 27/11507* (2013.01); *H01L 27/11509* (2013.01); *H01L 27/222* (2013.01)

(58) Field of Classification Search
None
See application file for complete search history.

(56) References Cited

U.S. PATENT DOCUMENTS

2017/0338241 A1\* 11/2017 Lee ................... H01L 29/66545

FOREIGN PATENT DOCUMENTS

KR 10-0933686 12/2009
KR 10-2013-0013065 2/2013

\* cited by examiner

*Primary Examiner* — Moazzam Hossain
*Assistant Examiner* — Stanetta D Isaac
(74) *Attorney, Agent, or Firm* — IP & T Group LLP

(57) ABSTRACT

A memory device includes first and second peripheral regions in which peripheral circuits related to data input/output are disposed, a normal cell region which is disposed on the first peripheral region, and in which a plurality of memory cells storing data are formed, and a dummy cell region which is disposed on the second peripheral region, and in which a plurality of dummy cells forming a plurality of capacitors are formed.

10 Claims, 14 Drawing Sheets

MEMORY DEVICE HAVING PUC STRUCTURE

CROSS-REFERENCE TO RELATED APPLICATION

This application claims priority under 35 U.S.C. § 119 to Korean Patent Application No. 10-2018-0112172, filed on Sep. 19, 2018, in the Korean Intellectual Property Office, the disclosure of which is incorporated herein by reference in its entirety.

BACKGROUND

1. Field

Various embodiments of the present invention relate to a semiconductor design technique, and more particularly, to a method of securing capacitance in a memory device having a Peri Under Cell (PUC) structure.

2. Description of the Related Art

In general, a memory device may be divided into a core region (i.e., a normal cell region) in which a memory cell array storing data is disposed, and a peripheral region in which peripheral circuits related to data input/output are disposed. The peripheral region may include unit circuits for performing predetermined functions, and capacitors for supplying a stable power supply voltage. Capacitors are typically designed in free space. Recently, however, as the chip size is reduced by high integration of the memory device, there is a need to reduce the occupied area and size of peripheral circuits. Accordingly, the space in which the capacitors can be formed tends to be reduced.

Recently, research is being actively conducted on next-generation memory devices for replacing a DRAM and a flash memory. One of such next-generation memories is a resistive memory device using a material which can switch between at least two different resistance states while its resistance is rapidly changed according to a bias applied thereto, that is, a variable resistance material. Representative examples of the resistive memory device may include a resistive random access memory (RRAM), a phase-change random access memory (PCRAM), a magnetic random access memory (MRAM), a ferroelectric random access memory (FRAM) and the like.

Particularly, the resistive memory device constitutes a memory cell array with a cross-point structure. The cross-point structure refers to a structure in which a plurality of bottom electrodes, e.g., a plurality of row lines (word lines), and a plurality of top electrodes, e.g., a plurality of column lines (bit lines), are formed so as to cross each other, and a memory cell in which a variable resistance element and a selection element are coupled in series to each other is disposed at each of the cross points of the bottom electrodes and the top electrodes.

A cross-point memory device may be configured to have a PUC structure in which a peripheral region is disposed under a core region when the device is integrated on a semiconductor substrate. At this time, since the cross-point memory device is not able to use a cell capacitor, unlike a DRAM, the capacity of the capacitor is absolutely insufficient. Therefore, a method for securing capacitance in the cross-point memory device is acutely demanded.

SUMMARY

Various embodiments are directed to a memory device having a PUC structure in which a plurality of capacitors may be formed using dummy cells formed on a peripheral region.

In accordance with an embodiment, a memory device may include: first and second peripheral regions in which peripheral circuits related to data input/output are disposed; a normal cell region which is disposed on the first peripheral region, and in which a plurality of memory cells storing data are formed; and a dummy cell region which is disposed on the second peripheral region, and in which a plurality of dummy cells forming a plurality of capacitors are formed.

In accordance with an embodiment, a memory device may include: a peripheral region including a plurality of lower metal wiring layers formed on a substrate; first and second upper metal wiring layers disposed on the peripheral region; a normal cell region disposed on the first upper metal wiring layer, coupled to the first upper metal wiring layer through a contact, and including a plurality of normal cells storing data; and a dummy cell region disposed on the second upper metal wiring layer, coupled to the second upper metal wiring layer through a contact, and including a plurality of dummy cells forming a plurality of capacitors.

In accordance with an embodiment, a memory device may include: first and second resistive cell arrays disposed in parallel on a substrate; and first and second peripheral circuits disposed under the first and second resistive cell arrays, respectively, wherein the first and second peripheral circuits exchange signals with the first resistive cell array to store data, and wherein the second resistive cell array includes a plurality of capacitors formed between word lines and bit lines thereof.

DETAILED DESCRIPTION

Figure 1:
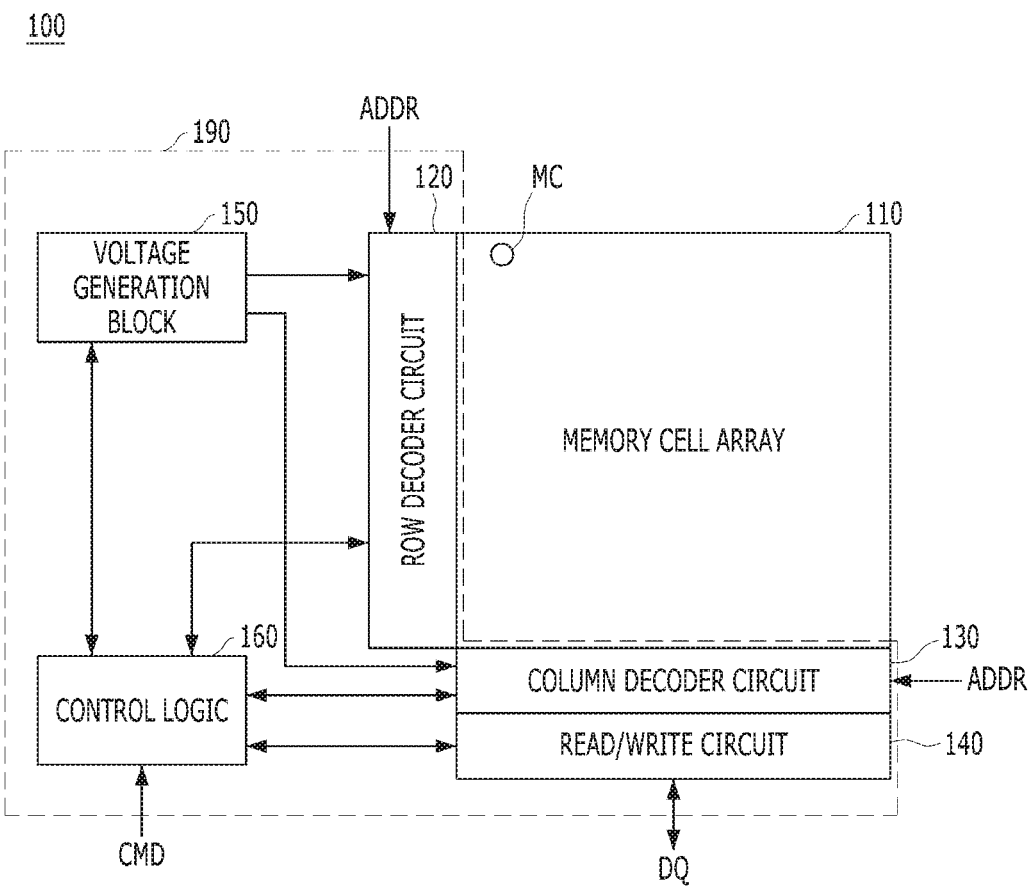
FIG. 1 is a block diagram illustrating a resistive memory device in accordance with an embodiment.

Various embodiments of the present invention are described below in detail with reference to the accompanying drawings. In doing so, detailed description related to well-known functions or configurations are omitted so as not unnecessarily obscure the subject matter of the present invention. Throughout the disclosure, like reference numerals refer to like parts throughout the various figures and embodiments of the present invention. Also, throughout the specification, reference to "an embodiment," "another embodiment" or the like is not necessarily to only one embodiment, and different references to any such phrase are not necessarily to the same embodiment(s).

In the disclosed embodiments, a resistive memory device (RRAM) will be taken as an example for description. However, the present embodiments may be applied to a memory device having a Peri Under Cell (PUC) structure, such as a flash memory, a phase change random access memory (PRAM) and a ferroelectric RAM (FRAM).

FIG. 1 is a block diagram illustrating a resistive memory device 100 in accordance with an embodiment.

Referring to FIG. 1, the resistive memory device 100 may include a memory cell array 110, a row decoder circuit 120, a column decoder circuit 130, a read/write circuit 140, a voltage generation block 150 and control logic 160. All components of the resistive memory device 100 collectively, except for the memory cell array 110, may be referred to as a peripheral circuit 190.

The memory cell array 110 may include a plurality of word lines, a plurality of bit lines and a plurality of resistive memory cells MC (normal cells MC). The memory cell array 110 may have an array structure in which the normal cells MC are disposed at respective cross points of the word lines and the bit lines.

Each of the row decoder circuit 120 and the column decoder circuit 130, which is an address decoder, may receive an external address signal ADDR. In response to the external address signal ADDR, the row decoder circuit 120 and the column decoder circuit 130 may decode a row address and a column address of a target memory cell to be accessed in the memory cell array 110 and select a word line and a bit line of the target memory cell, respectively, under the control of the control logic 160.

The read/write circuit 140 may receive data DQ from a data input/output circuit and write the data DQ to the memory cell array 110 under the control of the control logic 160, or provide data DQ read from a selected memory cell of the memory cell array 110 to the data input/output circuit under the control of the control logic 160. The read/write circuit 140 may include a sense amplifier or a write driver.

The voltage generation block 150 may generate an operational voltage such as a write voltage, a read verification voltage and a read voltage and provide the operational voltage to the row decoder circuit 120 and the column decoder circuit 130, under the control of the control logic 160.

The control logic 160 may control the row decoder circuit 120, the column decoder circuit 130, the read/write circuit 140 and the voltage generation block 150 in response to commands CMD inputted from an external device such as a controller or a host. For example, the control logic 160 controls the row decoder circuit 120, the column decoder circuit 130 and the read/write circuit 140 to write data to the memory cell array 110 in response to a write command. In addition, the control logic 160 controls the row decoder circuit 120, the column decoder circuit 130 and the read/write circuit 140 to read data from the memory cell array 110 in response to a read command.

Figure 2:
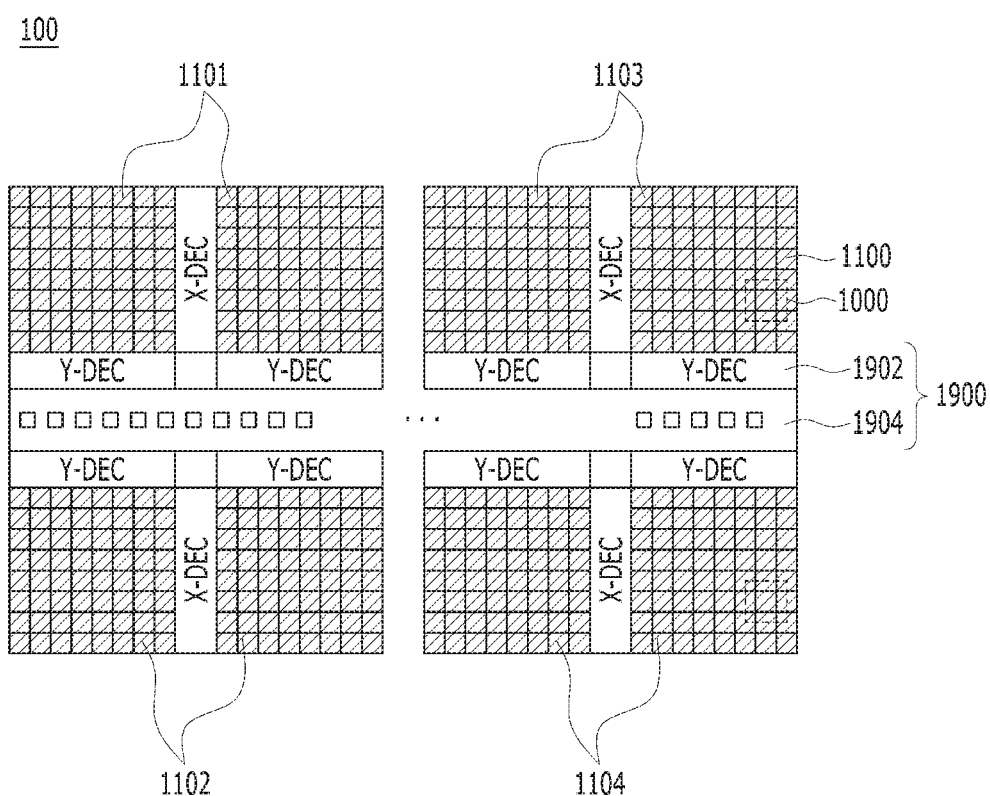
FIG. 2 is a diagram illustrating a layout of a resistive memory device shown in FIG. 1.

FIG. 2 is a diagram illustrating a layout of the resistive memory device 100 shown in FIG. 1.

Referring to FIG. 2, the memory cell array 110 may include one or more mats 1101, 1102, 1103 and 1104. In FIG. 2, "X-DEC" denotes the row decoder circuit 120, and "Y-DEC" denotes the column decoder circuit 130. Each of the mats 1101, 1102, 1103 and 1104 includes a plurality of unit memory cell arrays 1000, and one or more memory cells are selected by the decoders X-DEC and Y-DEC according to the address of the target memory cell.

The resistive memory device 100 may include a normal cell region 1100, in which the mats 1101, 1102, 1103 and 1104 of the memory cell array 110 are disposed, and a peripheral region 1900. The peripheral region 1900 may include a first peripheral region 1902, in which the row decoder circuit 120 and the column decoder circuit 130 adjacent to the memory cell array 110 are disposed, and a second peripheral region 1904, in which the read/write circuit 140, the voltage generation block 150, the control logic 160 and a data input/output processing block are disposed. A data input/output pad, an address pad, a command pad, a power supply pad such as a power supply voltage pad and a ground voltage pad and the like may also be disposed in the second peripheral region 1904.

A cross-point memory device may have a Peri Under Cell (PUC) structure in which the peripheral region 1900 is disposed under the normal cell region 1100 on a semiconductor substrate when the device is integrated.

Figure 3:
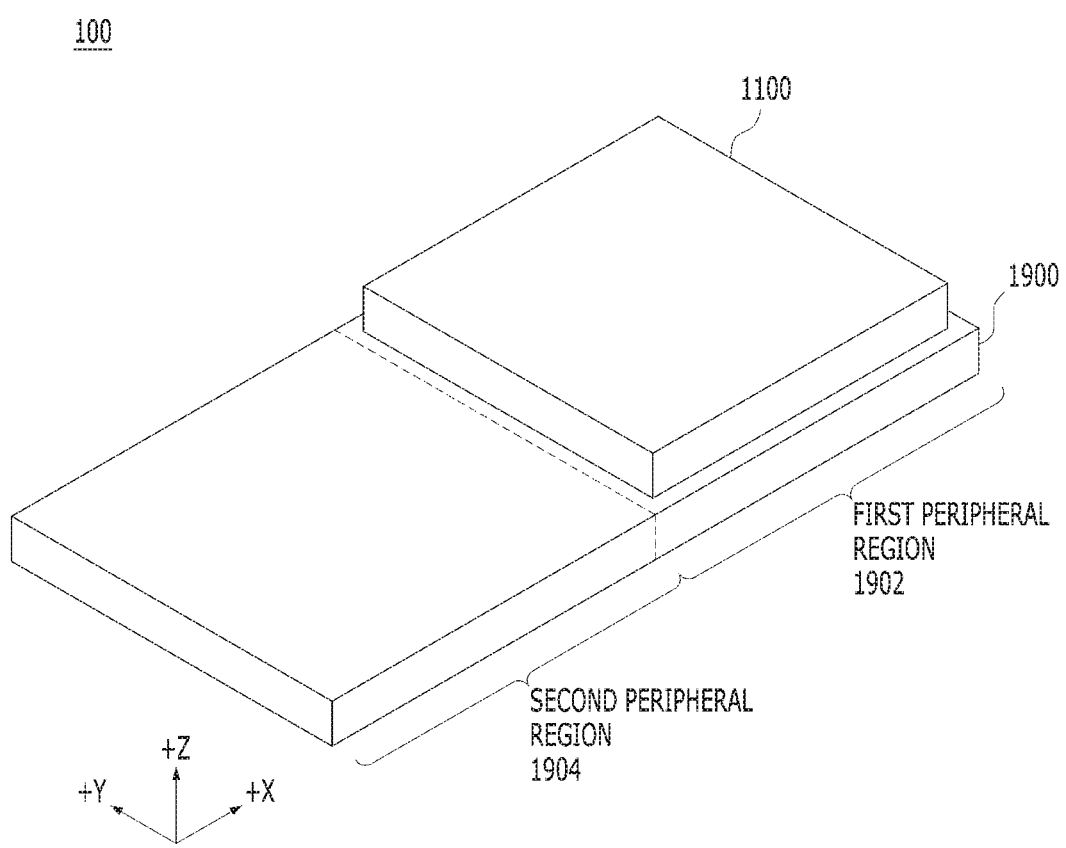
FIG. 3 is a perspective view illustrating a resistive memory device having a general PUC structure.

FIG. 3 is a perspective view illustrating the resistive memory device 100 having a general PUC structure.

Referring to FIG. 3, the peripheral region 1900 is disposed on a semiconductor substrate in the resistive memory device 100. The peripheral region 1900 may be divided into the first peripheral region 1902 and the second peripheral region 1904. Within the first peripheral region 1902, the row decoder circuit 120 and the column decoder circuit 130 may be disposed adjacent to the memory cell array 110. The other peripheral circuits may be disposed in the second peripheral region 1904. The memory device having the PUC structure may be implemented by disposing the memory cell array 110 on the first peripheral region 1902.

Since a step is formed between the normal cell region 1100 and the peripheral region 1900 within the resistive memory device having the PUC structure as described above, there are difficulties in performing a metal wiring process after the memory cell array 110 is formed.

Figure 4:
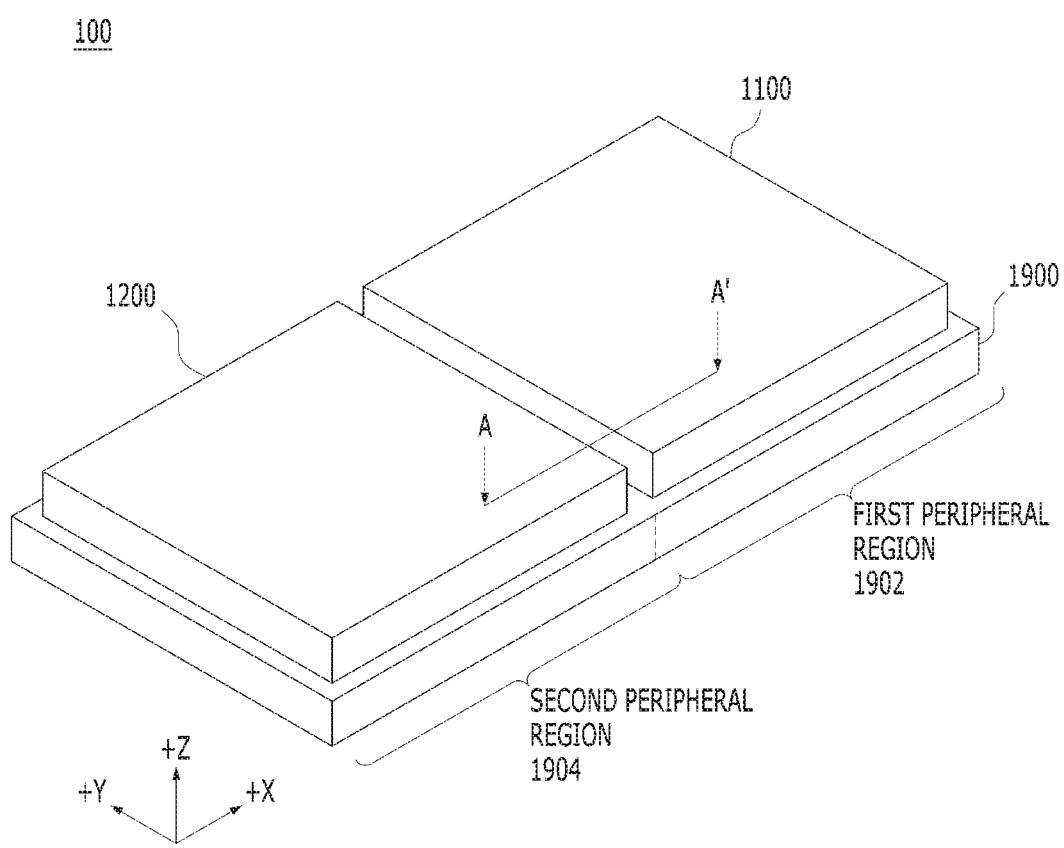
FIG. 4 is a perspective view illustrating a resistive memory device having a PUC structure in accordance with an embodiment.

FIG. 4 is a perspective view illustrating the resistive memory device 100 having a PUC structure in accordance with an embodiment.

Referring to FIG. 4, the peripheral region 1900 is disposed on a semiconductor substrate in the resistive memory device 100. Peripheral circuits related to data input/output may be disposed in the peripheral region 1900. The peripheral region 1900 may be divided into the first peripheral region 1902 and the second peripheral region 1904. The row decoder circuit 120 and the column decoder circuit 130 adjacent to the memory cell array 110 may be disposed in the first peripheral region 1902. The other peripheral circuits may be disposed in the second peripheral region 1904.

The resistive memory device 100 may include the normal cell region 1100 disposed on the first peripheral region 1902 and a dummy cell region 1200 disposed on the second peripheral region 1904. A plurality of memory cells storing data, that is, normal cells, may be formed in the normal cell region 1100. The dummy cell region 1200 may be disposed at one side of the normal cell region 1100 on the second peripheral region 1904. A plurality of dummy cells forming a plurality of capacitors may be formed in the dummy cell region 1200.

In accordance with an embodiment, as the dummy cell region 1200 in which the plurality of dummy cells are disposed is additionally formed on the second peripheral region 1904, a step between the normal cell region 1100 and the peripheral region 1900 may be minimized. Moreover, as the capacitors are formed using word lines and/or bit lines of the dummy cells formed in the dummy cell region 1200, the capacitance may be secured in a limited space without increasing the entire area.

Figure 5:
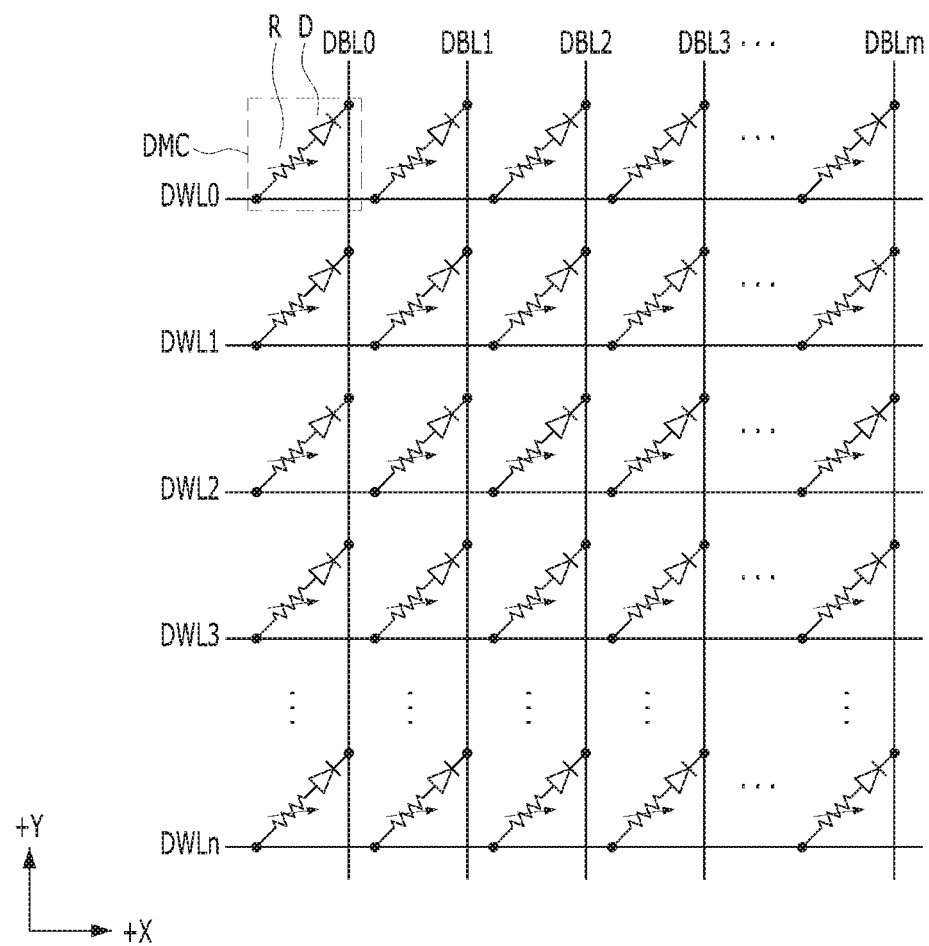
FIG. 5 is a diagram schematically illustrating a dummy cell array of a dummy cell region in accordance with an embodiment.

FIG. 5 is a diagram schematically illustrating the dummy cell region 1200 in accordance with an embodiment.

Referring to FIG. 5, a dummy cell array 200 in which a plurality of dummy cells DMC are arranged in an array may be disposed in the dummy cell region 1200. The dummy cell array 200 may include a plurality of dummy word lines DWL0 to DWLn, a plurality of dummy bit lines DBL0 to DBLm and a plurality of dummy cells DMC disposed at respective cross points of the dummy word lines DWL0 to DWLn and the dummy bit lines DBL0 to DBLm.

The dummy cells DMC may be formed using a process of forming the plurality of normal cells MC of FIG. 1, which are disposed in the memory cell array 110. In other words, the dummy cells DMC may be formed simultaneously through the same process as that of forming the normal cells MC. The dummy cells DMC may have the same configuration as the normal cells MC. For example, each of the dummy cells DMC may include a resistive memory element R and a selection element D. The resistive memory element R may be a variable resistance element or a variable resistance material, and the selection element D may be a switching element. The resistance value of the resistive memory element R may be varied by the voltage difference between a corresponding dummy word line and a corresponding dummy bit line. The resistive memory element R may be, for example, a phase-change memory cell using a chalcogenide compound, a magnetic memory cell using a magnetic tunneling effect, a resistive memory cell using a transition metal oxide, a polymer memory cell, a memory cell using perovskite, a ferroelectric memory cell using a ferroelectric capacitor, and/or other suitably constructed memory cells. The selection element D may be configured as a diode, a bipolar transistor or a MOS transistor.

As described above, the dummy cells DMC may be disposed between conductive lines/metal lines, i.e., the dummy word lines and the dummy bit lines when being integrated on the semiconductor substrate.

Figure 6A:
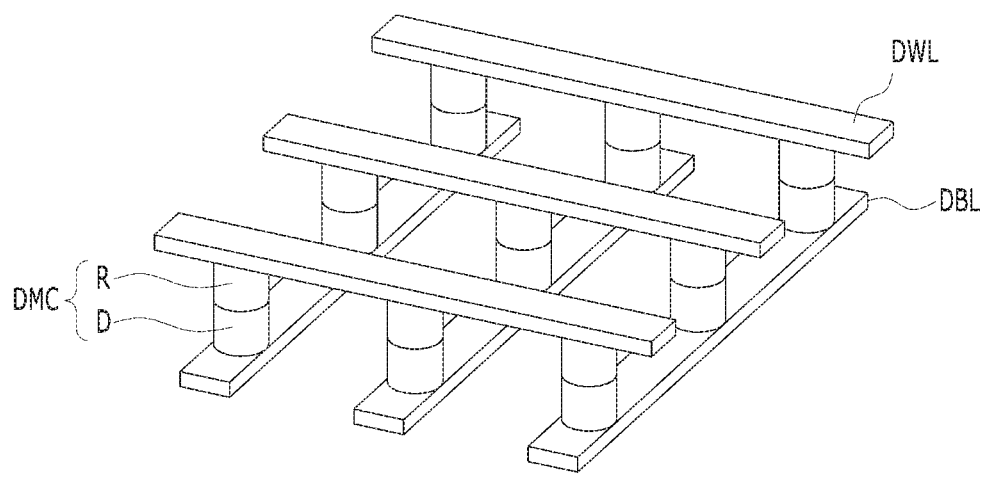
FIG. 6A is a perspective view illustrating a dummy cell array formed of one-plane in accordance with an embodiment.
Figure 6A:
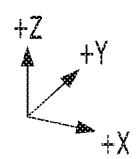

FIG. 6A is a perspective view illustrating the dummy cell array 200 having a one-plane (1-plane) structure in accordance with an embodiment.

Referring to FIG. 6A, the dummy cell array 200 may be implemented with a cross-point array having a plurality of dummy word lines DWL which extend in a first direction, i.e., an X direction, and are arranged in a second direction, i.e., a Y direction, a plurality of dummy bit lines DBL which extend in the Y direction and are arranged in the X direction, and a plurality of dummy cells DMC disposed at respective cross points of the dummy word lines DWL and the dummy bit lines DBL. For reference, the dummy word lines DWL in FIG. 6A may correspond to the dummy word lines DWL0 to DWLn in FIG. 5, and the dummy bit lines DBL may correspond to the dummy bit lines DBL0 to DBLm in FIG. 5.

Figure 6B:
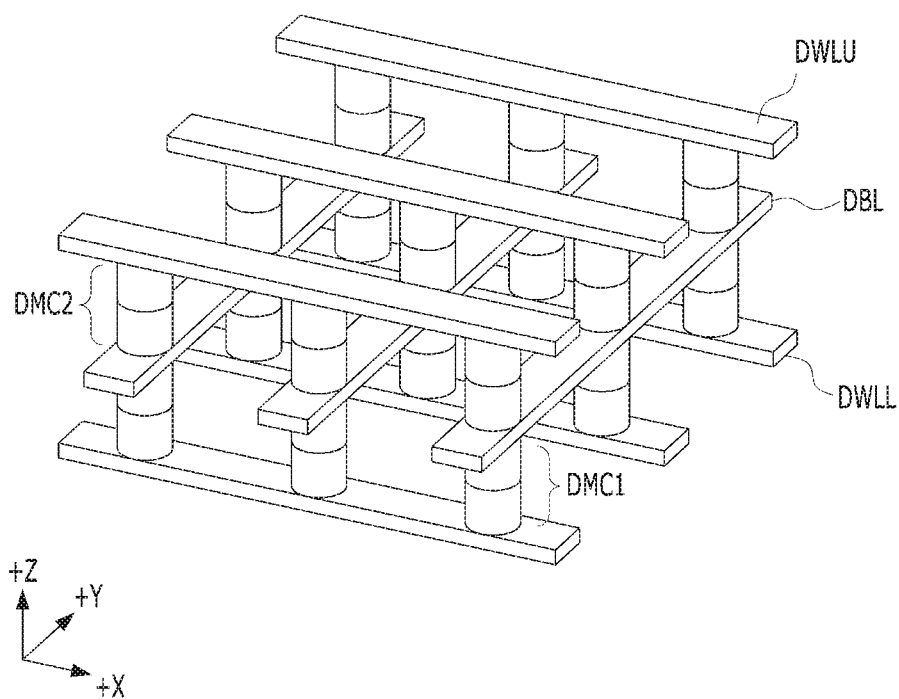
FIG. 6B is a perspective view illustrating a dummy cell array formed of two-plane in accordance with an embodiment.

FIG. 6B is a perspective view illustrating the dummy cell array 200 having a two-plane (2-plane) structure in accordance with an embodiment.

Referring to FIG. 6B, the dummy cell array 200 may be implemented with a cross-point array having a plurality of first dummy word lines DWLL and a plurality of second dummy word lines DWLU which extend in a first direction, i.e., an X direction, are arranged in a second direction, i.e., a Y direction, and are stacked in a third direction, i.e., a Z direction, a plurality of dummy bit lines DBL which extend in the Y direction and are arranged in the X direction between the first dummy word lines DWLL and the second dummy word lines DWLU disposed adjacent to each other in the Z direction, a plurality of first dummy cells DMC1 disposed at respective cross points of the first dummy word lines DWLL and the dummy bit lines DBL, and a plurality of second dummy cells DMC2 disposed at respective cross points of the second dummy word lines DWLU and the dummy bit lines DBL. Desirably, the X, Y and Z directions may be orthogonal to one another.

For reference, the first dummy word lines DWLL and the second dummy word lines DWLU in FIG. 6B may correspond to the dummy word lines DWL0 to DWLn in FIG. 5, and the dummy bit lines DBL may correspond to the dummy bit lines DBL0 to DBLm in FIG. 5.

The first dummy word lines DWLL and the second dummy word lines DWLU may be stacked in the Z direction, and thus a three-dimensional structure may be formed. The dummy bit lines DBL may be shared by the first dummy word lines DWLL and the second dummy word lines DWLU disposed adjacent in the Z direction. FIG. 6B shows an arrangement in which a pair of dummy word lines, that is, the first dummy word lines DWLL and the second dummy word lines in the Z direction, which may be defined as a 2-plane dummy cell array 200. For reference, FIG. 6A shows the 1-plane dummy cell array 200 in which the plurality of dummy word lines DWL extend in the X direction and are arranged in the Y direction without being stacked in the Z direction. However, the present invention is not limited thereto. More generally, the dummy cell array 200 may be formed to have a multi-plane structure in which two or more dummy word lines are stacked in the Z direction.

Figure 7:
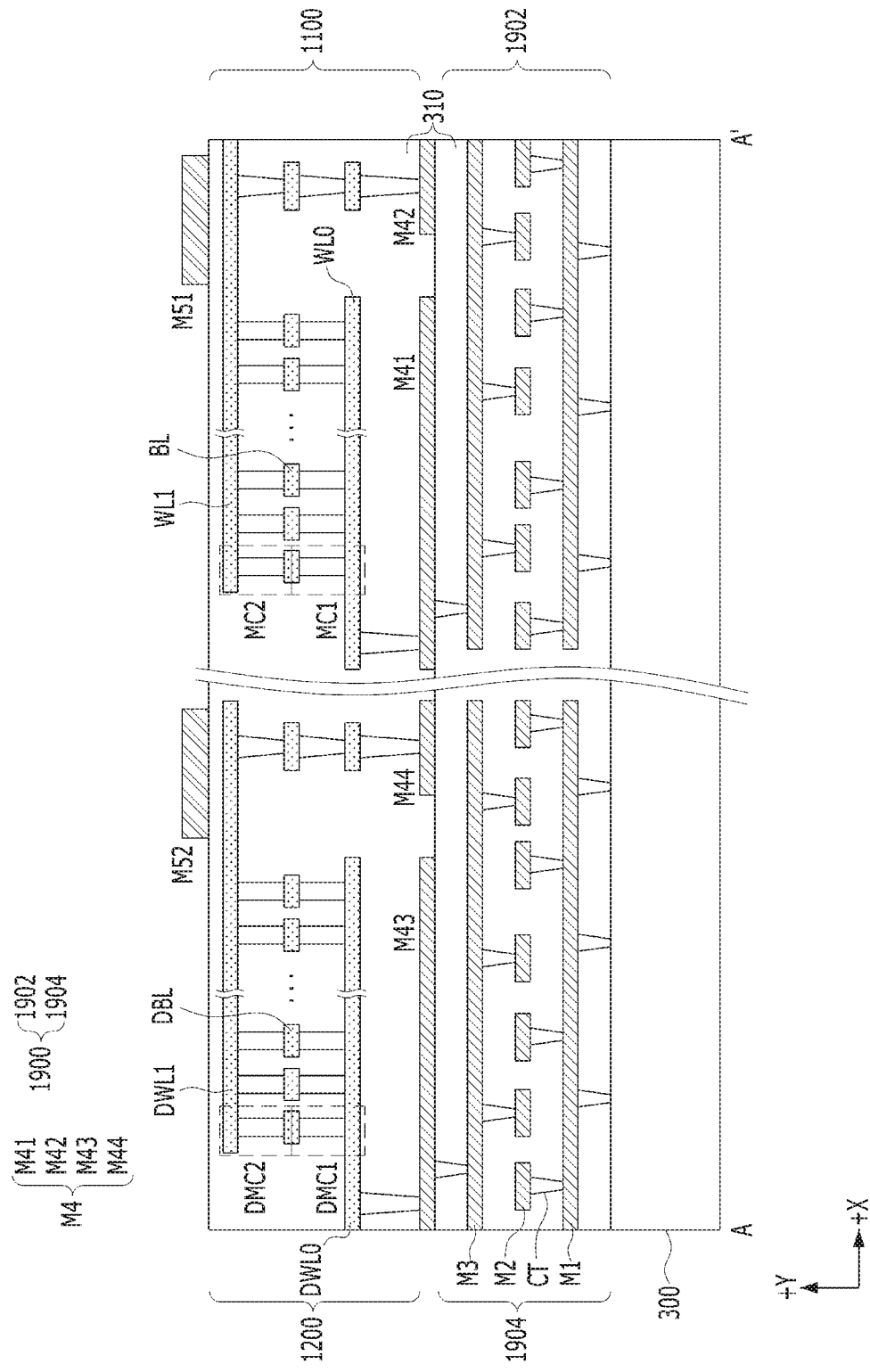
FIG. 7 is a cross-sectional view illustrating a resistive memory device having a PUC structure in accordance with an embodiment.

FIG. 7 is a cross-sectional view illustrating a resistive memory device, e.g., resistive memory device 100, having a PUC structure in accordance with an embodiment. FIG. 7 is a cross-sectional view taken along the line A-A' in FIG. 4. By way of example, the resistive memory device 100 including a dummy cell array having a 2-plane structure in which a pair of first and second dummy word lines DWL0 and DWL1 are stacked will be described as an example.

Referring to FIG. 7, the resistive memory device 100 may include the peripheral region 1900 formed on the semiconductor substrate 300 and divided into the first and second peripheral regions 1902 and 1904, the normal cell region 1100 formed on the first peripheral region 1902 and a dummy cell region 1200 formed on the second peripheral region 1904. The resistive memory device may include a plurality of first to fifth metal wiring layers M1 to M5. The first to third metal wiring layers M1 to M3 may be lower metal wiring layers, and the fourth and fifth metal wiring layers M4 and M5 may be upper metal wiring layers.

The first to third metal wiring layers M1 to M3 may be formed on the semiconductor substrate 300 and disposed in the peripheral region 1900. The first to third metal wiring layers M1 to M3 may be coupled to one another through contacts CT, and an interlayer insulating layer 310 may be disposed among the first to third metal wiring layers M1 to M3. A peripheral circuit may be disposed between the semiconductor substrate 300 and the interlayer insulating film 310. The peripheral circuit may include a plurality of transistors for performing various functions. Each of the transistors may include a gate electrode, and source and drain regions disposed symmetrically with respect to the gate electrode.

The fourth metal wiring layer M4 may be formed on the peripheral region 1900. The fourth metal wiring layer M4 may be coupled to the first to third metal wiring layers M1 to M3 through the contacts CT. The fourth metal wiring layer M4 may be divided into first upper metal wiring layers M41 and M42 which are disposed in the normal cell region 1100 and coupled to the first and second dummy word lines DWL0 and DWL1 through the contacts CT, and second upper metal wiring layers M43 and M44 which are disposed in the dummy cell ration 1200 and coupled to first and second word lines WL0 and WL1 through the contacts CT. The first upper metal wiring layers M41 and M42 may be coupled to a plurality of normal cells MC1 and MC2 through the first and second dummy word lines DWL0 and DWL1. The second upper metal wiring layers M43 and M44 may be coupled to a plurality of dummy cells DMC1 and MC2 through the first and second word lines WL0 and WL1.

The fifth metal wiring layer M5 may be divided into normal and dummy fifth metal wiring layers M51 and M52 and may be formed on the normal cell region 1100 and the dummy cell region 1200. That is, the normal cell region 1100 may be disposed between the first upper metal wiring layers M41 and M42 and the fifth normal metal wiring layer M51, and the dummy cell region 1200 may be disposed between the second upper metal wiring layers M43 and M44 and the fifth dummy metal wiring layer M52.

As illustrated in FIG. 7, the normal cells MC1 and MC2 of the normal cell region 1100 and the peripheral circuits of the first peripheral region 1902, i.e., the row decoder circuit 120 and the column decoder circuit 130 shown in FIG. 1, may be coupled to one another through the plurality of first to fourth metal wiring layers M1 to M4. The peripheral circuits of the first peripheral region 1902 and the peripheral circuits of the second peripheral region 1904, i.e., the read/write circuit 140, the voltage generation block 150 and the control logic 160 shown in FIG. 1 and the data input/output processing block, may be coupled to one another through the first to third metal wiring layers M1 to M3.

The normal cells MC1 and MC2 of the normal cell region 1100 and the dummy cells DMC1 and DMC2 of the dummy cell region 1200 may have a three-dimensional structure or a vertical structure. For example, the normal cells MC1 and MC2 and the dummy cells DMC1 and DMC2 may form a stacked structure along the Z direction on a plane extended along the X and Y directions. However, the peripheral circuits of the peripheral region 1900 have planar structures. The peripheral circuits are formed on a plane extended along the X and Z directions.

A method of forming capacitors using the dummy word lines and/or the dummy bit lines of the dummy cell region 1200 is described below.

Figure 8A:
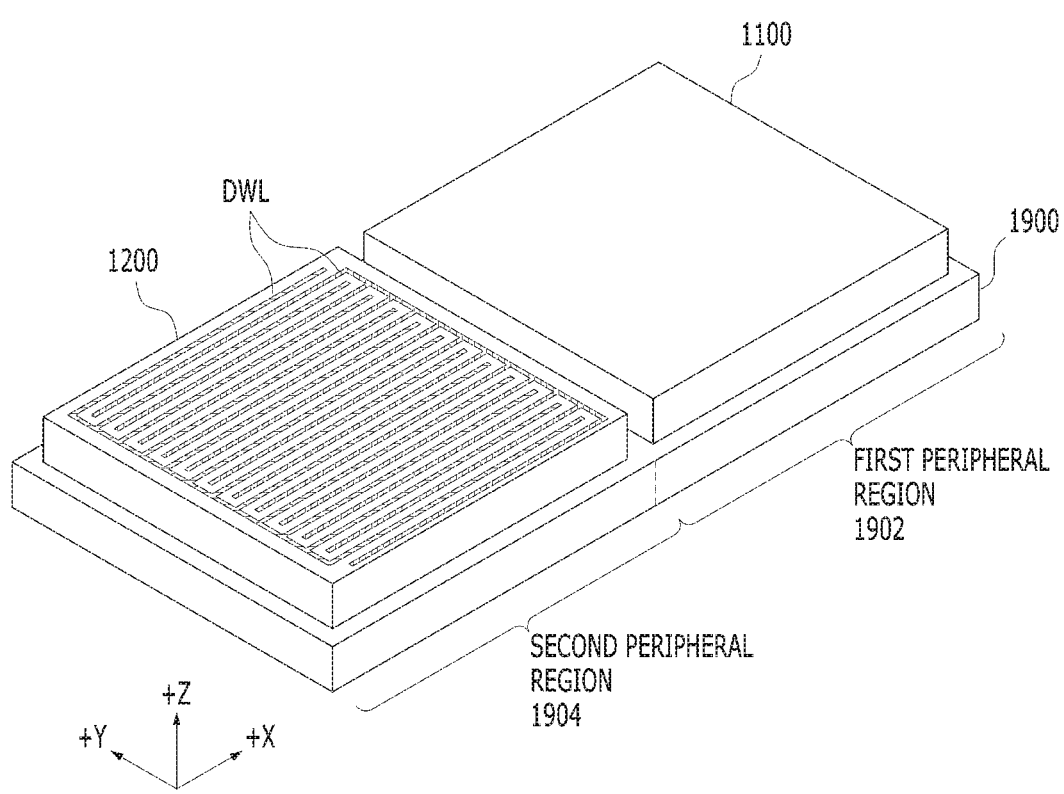
FIGS. 8A and 8B are a perspective view and a layout view, respectively, illustrating capacitors formed between dummy word lines of a dummy cell region in accordance with an embodiment.
Figure 8B:
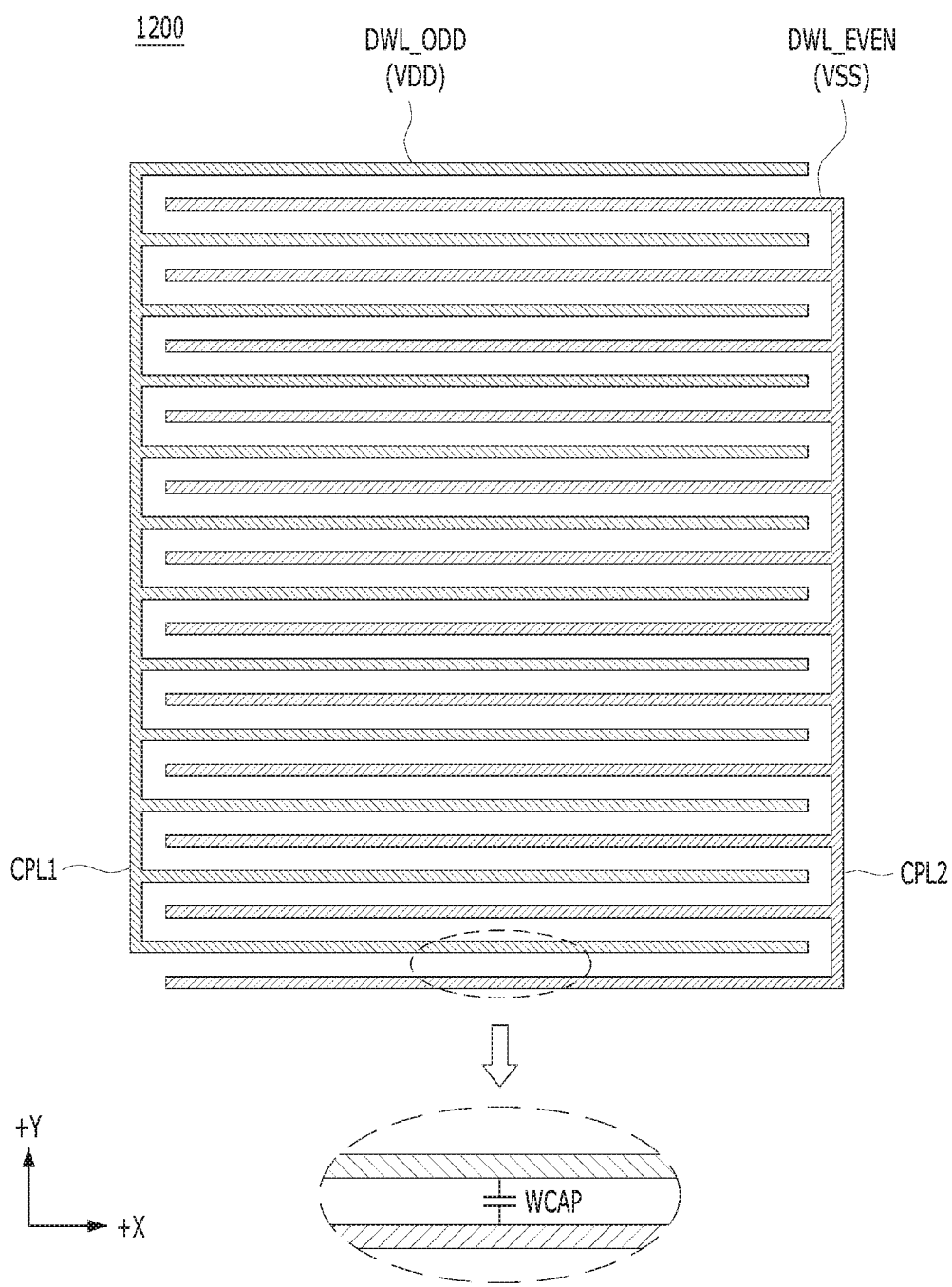

FIGS. 8A and 8B are a perspective view and a layout view, respectively, illustrating capacitors WCAP formed between the dummy word lines DWL of the dummy cell region 1200 in accordance with an embodiment.

Referring to FIGS. 8A and 83, the plurality of dummy word lines DWL of the dummy cell region 1200 may include odd-numbered dummy word lines DWL_ODD coupled to a power supply voltage VDD terminal and even-numbered dummy word lines DWL_EVEN coupled to a ground voltage VSS terminal. Particularly, in the illustrated embodiment, a first coupling unit CPL1 and a second coupling unit CPL2 may be additionally disposed in the dummy cell region 1200. The first coupling unit CPL1 may be disposed on one side of the plurality of dummy word lines DWL, and extend in a Y direction orthogonal to an X direction in which the plurality of dummy word lines DWL extend, to couple the odd-numbered dummy word lines DWL_ODD to one another. The second coupling unit CPL2 may be disposed on the other side of the plurality of dummy word lines DWL, and extend in the Y direction to couple the even-numbered dummy word lines DWL_EVEN to one another. Having the above-described structure, the plurality of capacitors WCAP may be formed between the odd-numbered dummy word lines DWL_ODD and the even-numbered dummy word lines DWL_EVEN. The plurality of capacitors WCAP may be serially coupled to one another in the Y direction between the odd-numbered dummy word lines DWL_ODD and the even-numbered dummy word lines DWL_EVEN.

In the dummy cell array having a 1-plane structure, the odd-numbered dummy word lines DWL_ODD may include dummy word lines DWL0, DWL2, . . . DWLn−1, and the even-numbered dummy word lines DWL_EVEN may include dummy word lines DWL1, DWL3, . . . , DWLn.

In the dummy cell array having a 2-plane structure, at least one of the first dummy word lines DWLL and the second dummy word lines DWLU may be disposed having the structure of FIGS. 8A and 8B. According to embodiments, when both of the first dummy word lines DWLL and the second dummy word lines DWLU are disposed in the structure of FIGS. 8A and 86, the odd-numbered word lines DWLL_ODD of the first dummy word lines DWLL and the odd-numbered word lines DWLU_ODD of the second dummy word lines DWLU are configured to receive different power supply voltages so that a plurality of capacitors may be additionally formed in a Z direction between the odd-numbered word lines DWLL_ODD and the odd-numbered word lines DWLU_ODD. Similarly, the even-numbered dummy word lines DWLL_EVEN of the first dummy word lines DWLL and the even-numbered dummy word lines DWLU_EVEN of the second dummy word lines DWLU are configured to receive different power supply voltages so that a plurality of capacitors may be additionally formed in the Z direction between the even-numbered dummy word lines DWLL_EVEN and the even-numbered dummy word lines DWLU_EVEN.

Although it is described in FIGS. 8A and 86 that the odd-numbered dummy word lines DWL_ODD are coupled to the power supply voltage VDD terminal and the even-numbered dummy word lines DWL_EVEN are coupled to the ground voltage VSS terminal, the present invention is not limited to that arrangement. Other arrangements consistent with the teachings herein may be used. In other words, the odd-numbered dummy word lines DWL_ODD may be coupled to the ground voltage VSS terminal, and the even-numbered dummy word lines DWL_EVEN may be coupled to the power supply voltage VDD terminal.

Figure 9A:
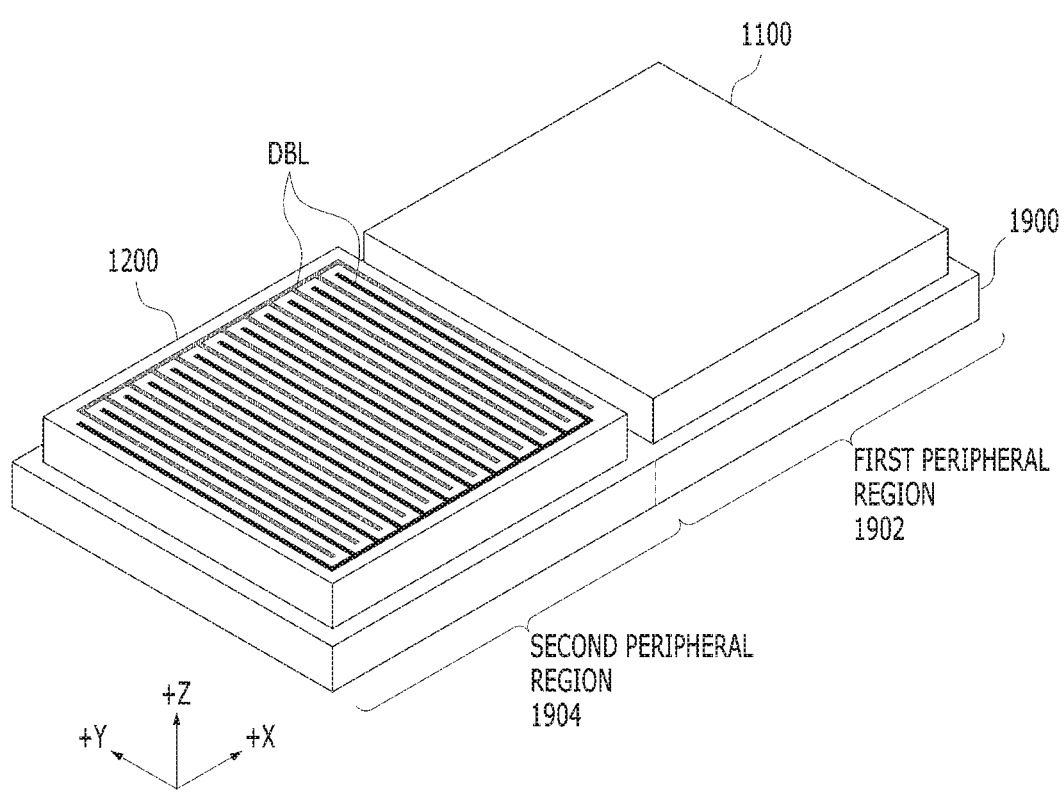
FIGS. 9A and 9B are a perspective view and a layout view, respectively, illustrating capacitors formed between dummy bit lines of a dummy cell region in accordance with an embodiment.
Figure 9B:
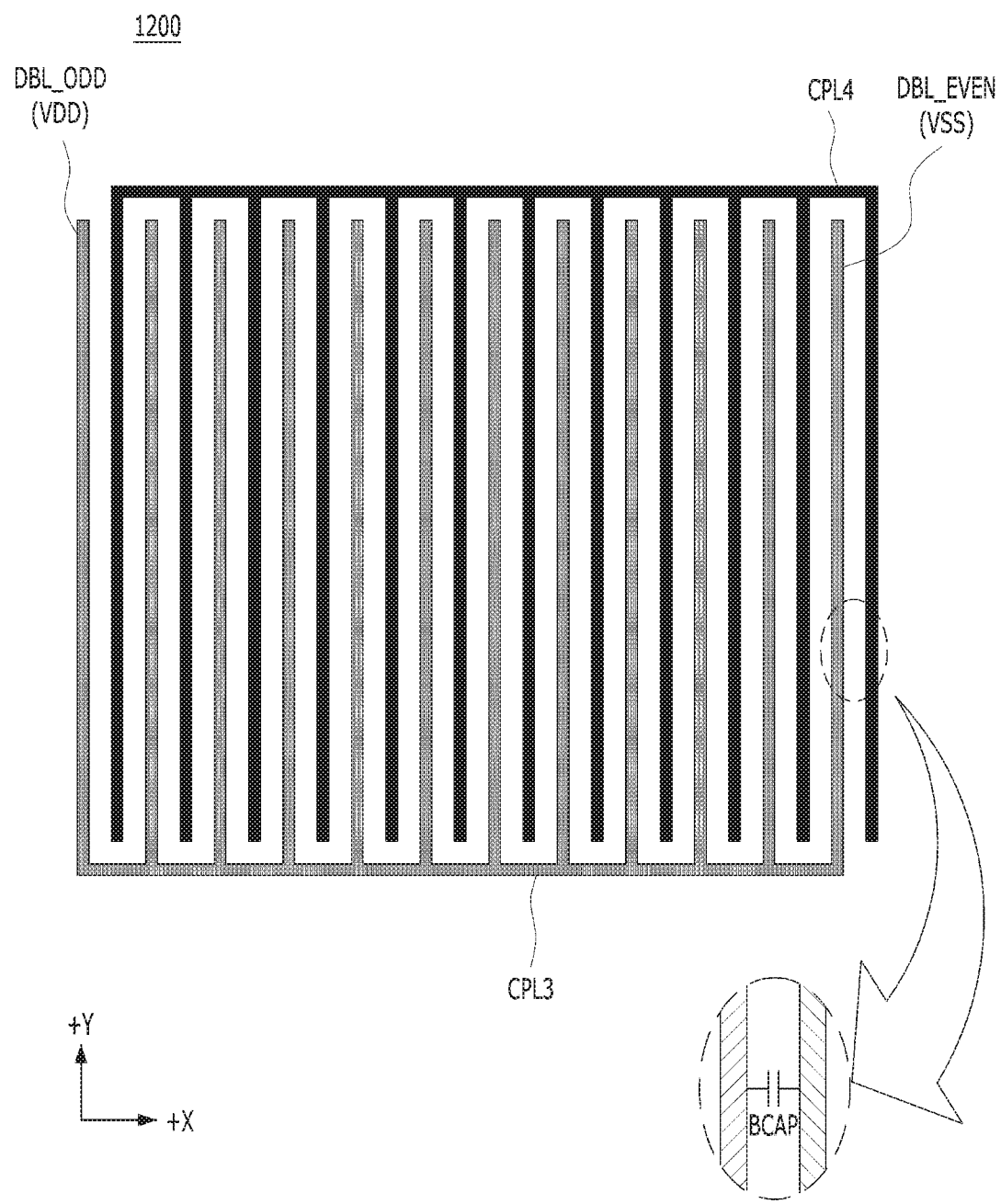

FIGS. 9A and 9B are a perspective view and a layout view, respectively, illustrating capacitors BCAP formed between the dummy bit lines DBL of the dummy cell region 1200 in accordance with an embodiment.

Referring to FIGS. 9A and 9B, the plurality of dummy bit lines DBL of the dummy cell region 1200 may include odd-numbered dummy bit lines DBL_ODD coupled to a power supply voltage VDD terminal and even-numbered dummy bit lines DBL_EVEN coupled to a ground voltage VSS terminal. Particularly, in the present embodiment, a third coupling unit CPL3 and a fourth coupling unit CPL4 may be additionally disposed in the dummy cell region 1200. The third coupling unit CPL3 may be disposed on one side of the plurality of dummy bit lines DBL, and extend in an X direction orthogonal to a Y direction in which the plurality of dummy bit lines DBL extend, to couple the odd-numbered dummy bit lines DBL_ODD to one another. The fourth coupling unit CPL4 may be disposed on the other side of the plurality of dummy bit lines DBL, and extend in the X direction to couple the even-numbered dummy bit lines DBL_EVEN to one another. Having the above-described structure, the plurality of capacitors BCAP may be formed between the odd-numbered dummy bit lines DBL_ODD and the even-numbered dummy bit lines DBL_EVEN. The plurality of capacitors BCAP may be serially coupled to one another in the X direction between the odd-numbered dummy bit lines DBL_ODD and the even-numbered dummy bit lines DBL_EVEN.

Although it is described in FIGS. 9A and 9B that the odd-numbered dummy bit lines DBL_ODD are coupled to the power supply voltage VDD terminal, and the even-numbered dummy bit lines DBL_EVEN are coupled to the ground voltage VSS terminal, the present invention is not limited to that arrangement. Other arrangements consistent with the teachings herein may be used. In other words, the odd-numbered dummy bit lines DBL_ODD may be coupled to the ground voltage VSS terminal, and the even-numbered dummy bit lines DBL_EVEN may be coupled to the power supply voltage VDD terminal.

Figure 10A:
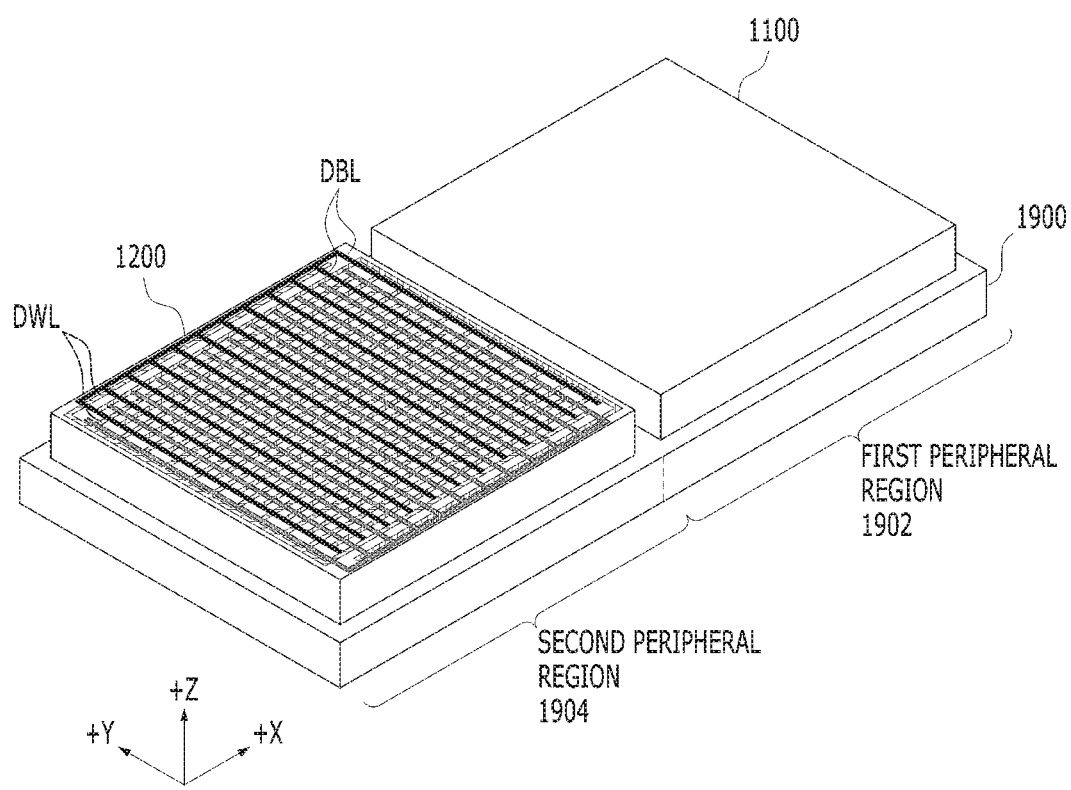
FIGS. 10A and 10B are a perspective view and a layout, respectively, illustrating capacitors formed between dummy word lines and dummy bit lines of a dummy cell region in accordance with an embodiment.
Figure 10B:
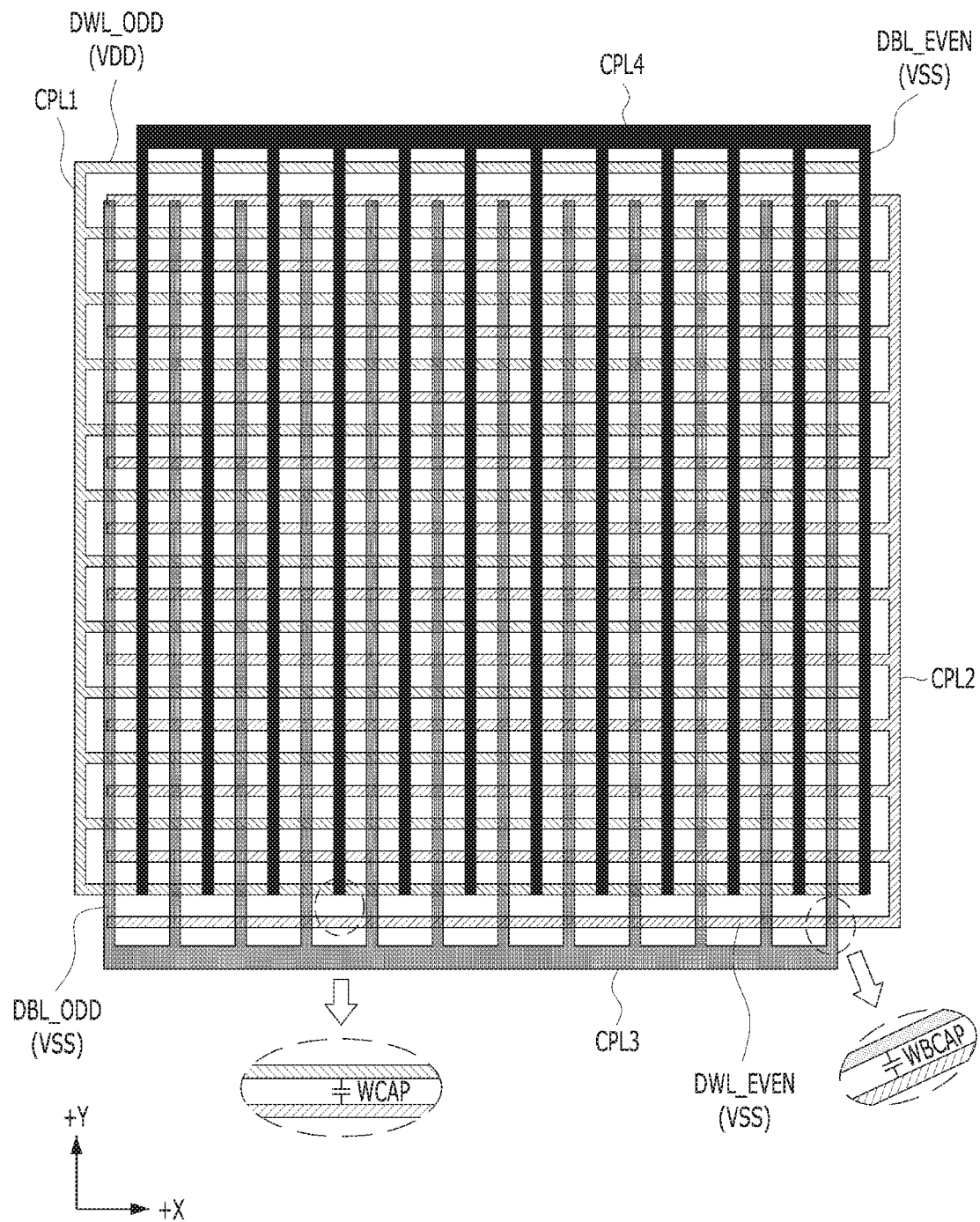

FIGS. 10A and 10B are a perspective view and a layout view, respectively, illustrating capacitors WCAP and WBCAP formed between the dummy word lines DWL and the dummy bit lines DBL of the dummy cell region 1200 in accordance with an embodiment.

Referring to FIGS. 10A and 10B, the plurality of dummy word lines DWL of the dummy cell region 1200 may include odd-numbered dummy word lines DWL_ODD coupled to a power supply voltage VDD terminal and even-numbered dummy word lines DWL_EVEN coupled to a ground voltage VSS terminal. The plurality of dummy bit lines DBL of the dummy cell region 1200 may include odd-numbered dummy bit lines DBL_ODD coupled to the ground voltage VSS terminal and even-numbered dummy bit lines DBL_EVEN coupled to the ground voltage VSS terminal. In addition, first to fourth coupling units CPL1 to CPL4 may be additionally disposed in the dummy cell region 1200. The first coupling unit CPL1 may be disposed on one side of the plurality of dummy word lines DWL, and extend in a Y direction to couple the odd-numbered dummy word lines DWL_ODD to one another. The second coupling unit CPL2 may be disposed on the other side of the plurality of dummy word lines DWL, and extend in the Y direction to couple the even-numbered dummy word lines DWL_EVEN to one another. The third coupling unit CPL3 may be disposed on one side of the plurality of dummy bit lines DBL, and extend in an X direction to couple the odd-numbered dummy bit lines DBL_ODD to one another. The fourth coupling unit CPL4 may be disposed on the other side of the plurality of dummy bit lines DBL, and may extend in the X direction to couple the even-numbered dummy bit lines DBL_EVEN to one another.

Having the above-described structure, the plurality of capacitors WCAP may be formed between the odd-numbered dummy word lines DWL_ODD and the even-numbered dummy word lines DWL_EVEN. At the same time, the plurality of capacitors WBCAP may be formed between the odd-numbered dummy word lines DWL_ODD and the dummy bit lines DBL_ODD and DBL_EVEN. The plurality of capacitors WCAP may be serially coupled to one another in the Y direction between the odd-numbered dummy word lines DWL_ODD and the even-numbered dummy word lines DWL_EVEN. The plurality of capacitors WBCAP may be formed in a Z direction between the odd-numbered dummy word lines DWL_ODD and the dummy bit lines DBL_ODD and DBL_EVEN.

In the dummy cell array having a 1-plane structure, the odd-numbered dummy word lines DWL_ODD may include dummy word lines DWL0, DWL2, . . . DWLn−1, and the even-numbered dummy word lines DWL_EVEN may include dummy word lines DWL1, DWL3, . . . , DWLn.

In the dummy cell array having a 2-plane structure, at least one of the first dummy word lines DWLL and the second dummy word lines DWLU may be disposed in the structure of FIGS. 10A and 10B. When both of the first dummy word lines DWLL and the second dummy word lines DWLU are disposed in the structure of FIGS. 10A and 10B, the plurality of capacitors WBCAP may be formed in the Z direction between the odd-numbered dummy word lines DWLL_ODD of the first dummy word lines DWLL and the dummy bit lines DBL_ODD and DBL_EVEN, and formed in the Z direction between the odd-numbered dummy word lines DWLU_ODD of the second dummy word lines DWLU and the dummy bit lines DBL_ODD and DBL_EVEN.

As is apparent from the above description, in the cross point memory device having the PUC structure, the dummy cells may be formed on the peripheral region through the existing process, and the capacitors may be formed using the word lines and/or bit lines of the dummy cells. Therefore, there is an effect that the capacitance may be secured in a limited space without increasing the entire area.

While the present invention has been illustrated and described with respect to specific embodiments, such embodiments are not intended to be restrictive, but rather descriptive. Further, it is noted that the present invention may be achieved in various ways through substitution, change, and modification, as those skilled in the art will understand in light of the present disclosure, without departing from the spirit and/or scope of the present invention as defined by the following claims.

What is claimed is:

1. A memory device comprising:
   first and second peripheral regions in which peripheral circuits related to data input/output are disposed;
   a normal cell region which is disposed on the first peripheral region, and in which a plurality of memory cells storing data are formed; and
   a dummy cell region which is disposed on the second peripheral region, and in which a plurality of dummy cells forming a plurality of capacitors are formed,
   wherein the dummy cell region includes: a plurality of dummy word lines extended in a first direction and arranged in a second direction; and a plurality of dummy bit lines extended in the second direction and arranged in the first direction, wherein the plurality of dummy cells are coupled between the dummy word lines and the dummy bit lines, and wherein the plurality of dummy word lines include:

odd-numbered dummy word lines coupled to a first power supply voltage terminal; and even-numbered dummy word lines coupled to a second power supply voltage terminal, wherein the capacitors are formed between the odd-numbered dummy word lines and the even-numbered dummy word lines.

2. The memory device of claim 1, wherein the dummy cell region further includes:

a first coupling unit disposed on one side of the dummy word lines, and extended in the second direction to couple the odd-numbered dummy word lines to one another; and a second coupling unit disposed on the other side of the dummy word lines, and extended in the second direction to couple the even-numbered dummy word lines to one another.

3. The memory device of claim 1, wherein the plurality of dummy bit lines are coupled to the second power supply voltage terminal, wherein the capacitors are formed between the odd-numbered dummy word lines and the dummy bit lines.

4. The memory device of claim 1, wherein a row decoder circuit and a column decoder circuit are disposed in the first peripheral region.

5. A memory device comprising:

first and second peripheral regions in which peripheral circuits related to data input/output are disposed;

a normal cell region which is disposed on the first peripheral region, and in which a plurality of memory cells storing data are formed; and a dummy cell region which is disposed on the second peripheral region, and in which a plurality of dummy cells forming a plurality of capacitors are formed, wherein the dummy cell region includes: a plurality of dummy word lines extended in a first direction and arranged in a second direction; and a plurality of dummy bit lines extended in the second direction and arranged in the first direction, wherein the plurality of dummy cells are coupled between the dummy word lines and the dummy bit lines, wherein the plurality of dummy bit lines include:

odd-numbered dummy bit lines coupled to a first power supply voltage terminal; and even-numbered dummy bit lines coupled to a second power supply voltage terminal, and wherein the capacitors are formed between the odd-numbered dummy bit lines and the even-numbered dummy bit lines.

6. The memory device of claim 5, wherein the dummy cell region further includes:

a third coupling unit disposed on one side of the dummy bit lines, and extended in the first direction to couple the odd-numbered dummy bit lines to one another; and a fourth coupling unit disposed on the other side of the dummy bit lines, and extended in the second direction to couple the even-numbered dummy bit lines to one another.

7. A memory device comprising:

first and second peripheral regions in which peripheral circuits related to data input/output are disposed;

a normal cell region which is disposed on the first peripheral region, and in which a plurality of memory cells storing data are formed; and a dummy cell region which is disposed on the second peripheral region, and in which a plurality of dummy cells forming a plurality of capacitors are formed, wherein the dummy cell region includes: a plurality of first dummy word lines and a plurality of second dummy word lines extended in a first direction and arranged in a second direction, and stacked in a third direction; a plurality of dummy bit lines extended in the second direction and arranged in the first direction between the first dummy word lines and the second dummy word lines disposed adjacent to each other in the third direction; a plurality of first dummy cells disposed at cross points of the first dummy word lines and the dummy bit lines, respectively; and a plurality of second dummy cells disposed at cross points of the second dummy word lines and the dummy bit lines, respectively, wherein the plurality of first dummy word lines include:

first odd-numbered dummy word lines coupled to a first power supply voltage terminal; and first even-numbered dummy word lines coupled to a second power supply voltage terminal, and wherein the capacitors are formed between the first odd-numbered dummy word lines and the first even-numbered dummy word lines.

8. The memory device of claim 7, wherein the plurality of second dummy word lines include:

second odd-numbered dummy word lines coupled to the second power supply voltage terminal; and second even-numbered dummy word lines coupled to the first power supply voltage terminal, wherein the capacitors are formed between the second odd-numbered dummy word lines and the second even-numbered dummy word lines, between the first odd-numbered dummy word lines and the second odd-numbered dummy word lines, and between the first even-numbered dummy word lines and the second even-numbered dummy word lines.

9. The memory device of claim 7, wherein the plurality of dummy bit lines are coupled to the second power supply voltage terminal, wherein the capacitors are formed between the first odd-numbered dummy word lines and the dummy bit lines.

10. A memory device comprising:

first and second peripheral regions in which peripheral circuits related to data input/output are disposed;

a normal cell region which is disposed on the first peripheral region, and in which a plurality of memory cells storing data are formed; and a dummy cell region which is disposed on the second peripheral region, and in which a plurality of dummy cells forming a plurality of capacitors are formed, wherein the dummy cell region includes: a plurality of first dummy word lines and a plurality of second dummy word lines extended in a first direction and arranged in a second direction, and stacked in a third direction; a plurality of dummy bit lines extended in the second direction and arranged in the first direction between the first dummy word lines and the second dummy word lines disposed adjacent to each other in the third direction; a plurality of first dummy cells disposed at cross points of the first dummy word lines and the dummy bit lines, respectively; and a plurality of second dummy cells disposed at cross points of the second dummy word lines and the dummy bit lines, respectively, wherein the plurality of dummy bit lines include:
odd-numbered dummy bit lines coupled to a first power supply voltage terminal; and
even-numbered dummy bit lines coupled to a second power supply voltage terminal, and
wherein the capacitors are formed between the odd-numbered dummy bit lines and the even-numbered dummy bit lines.

* * * * *